(12) United States Patent
Chen et al.

(10) Patent No.: US 6,867,134 B2
(45) Date of Patent: Mar. 15, 2005

(54) ADHERENT ALL-GOLD ELECTRODE STRUCTURE FOR LITHIUM NIOBATE BASED DEVICES AND THE METHOD OF FABRICATION

(75) Inventors: Xingfu Chen, Eden Prairie, MN (US); Daniel Lynch, Southwick, MA (US); Nelson Mark, Manchester, CT (US); Walter Bosenberg, Simsbury, CT (US); Jason Xu, New Haven, CT (US); Lawrence Brodsky, Tolland, CT (US); John Clark, Somers, CT (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 10/393,508

(22) Filed: Mar. 20, 2003

(65) Prior Publication Data

US 2004/0002205 A1 Jan. 1, 2004

Related U.S. Application Data

(60) Provisional application No. 60/365,991, filed on Mar. 20, 2002.

(51) Int. Cl.$^7$ ............................................... H01L 21/44
(52) U.S. Cl. ...................................................... 438/686
(58) Field of Search ........................... 438/686, 3, 687, 438/681, 660, 627, 624, 606, 396, 386, 199; 257/412, 649, 310

(56) References Cited

U.S. PATENT DOCUMENTS

| | | | |
|---|---|---|---|
| 4,750,979 A | 6/1988 | Gee et al. ................. | 204/192.3 |
| 6,187,665 B1 | * 2/2001 | Chetlur et al. .............. | 438/627 |
| 6,522,793 B1 | 2/2003 | Szilagyi et al. ................ | 385/2 |

OTHER PUBLICATIONS

Robert F.Pierret, Field Effect Devices, 1983, Addison–Wesley Publishing Company, Inc, vol. IV, cover and pp. 63 and 82.*

U.S. patent application Ser. No. 10/261,877, Chen, filed Oct. 1, 2002.

* cited by examiner

*Primary Examiner*—Michael Tokar
*Assistant Examiner*—Monica D. Harrison
(74) *Attorney, Agent, or Firm*—Allen, Dyer, Doppelt, Milbrath & Gilchrist, P.A.

(57) ABSTRACT

An electrode structure wherein galvanic corrosion at adhesion layers formed between electrodes and electronic or electro-optic substrates is eliminated. The electrode structure includes an electro-optic crystalline substrate, an amorphous layer disposed on the crystalline substrate, the amorphous layer having a composition substantially similar to a composition of the crystalline substrate, and a gold layer disposed directly on the amorphous layer. The amorphous layer is created using ion sputtering etching techniques that clean and activate the surface of the crystalline substrate such that the gold layer is able to adhere to it.

22 Claims, 3 Drawing Sheets

ADHERENT ALL-GOLD ELECTRODE STRUCTURE FOR LITHIUM NIOBATE BASED DEVICES AND THE METHOD OF FABRICATION

CROSS-REFERENCE TO RELATED APPLICATIONS

The present invention claims priority from U.S. Patent Application No. 60/365,991 filed Mar. 20, 2002.

FIELD OF THE INVENTION

The present invention relates generally to electronic and electro-optic devices, and in particular, to metalized structures, such as electrodes, deposited directly on electronic or electro-optic substrates and methods of manufacturing the same.

BACKGROUND OF THE INVENTION

Substrate metalization has been widely used in microelectronics and optoelectronics industries. It is often necessary to apply one or more inner metal layers in addition to the desired top metal layer to a substrate to form a functional metalized structure. The metalized structures may consist of two or more dissimilar metals due to various requirements such as adhesion, diffusion barrier, thermal barrier, oxidation resistance, and so on. Such multi-layer metalized structures have a galvanic corrosion problem when exposed to moisture, owing to the differences in electrochemical potentials of the dissimilar metals. Galvanic corrosion cells are created at areas of water condensation during device service. Such galvanic corrosion can cause current leakage, short circuit, or other problems causing device failures.

Many electronic and electo-optic devices include electrically conductive electrodes formed on the substrate material. Gold (Au) is commonly used as an electrode material because it exhibits high electrical conductivity and excellent resistance to chemical corrosion. Copper (Cu), silver, and platinum (Pt) are also used as electrode materials. These materials, however, do not readily adhere to typical substrate materials. For example, gold does not easily adhere to lithium niobate ($LiNbO_3$), which is an electro-optic substrate material that is used in devices such as light modulators for optical communication systems.

Accordingly, adhesion layers are frequently deposited on the substrate prior to depositing the electrodes to improve the adhesion. Known adhesion layers are thin film layers of an active metal or metal alloy that have good adhesion to a desired substrate and good adhesion to gold or other electrode metals. For example, chromium (Cr), titanium (Ti), or titanium-tungsten (TiW) adhesion layers have been used to form gold electrodes on lithium niobate substrates.

The electrodes are typically deposited on the adhesion layer by electroplating. The adhesion layer between the gold electrodes is then etched away, thereby leaving completed electrodes that form electrical contact to the device. Unfortunately, electrodes formed with known methods of fabricating gold electrodes with an adhesion layer are sometimes unreliable.

Galvanic corrosion caused by the presence of dissimilar metals can occur around the electrode-adhesion layer interface when the device is exposed to moisture and ionic contamination. The active metal adhesion layer functions as an anode and corrodes in the presence of moisture and condensation inside the device package. Corrosion negatively impacts the performance and reduces the service life of an electronic or electro-optic device.

Another problem with known adhesion layers is that the final etching step to remove the adhesion layer between the electrodes often undercuts the adhesion layer beneath the electrode. The undercut can negatively affect the performance of electronic or electro-optic devices. The undercut can also trap moisture and contaminants and thus increase galvanic corrosion.

Galvanic corrosion can be reduced by reducing the amount of moisture around the electrode-active metal interface. This is sometimes difficult or impossible to accomplish if the device is not hermetically sealed. Galvanic corrosion can even occur in hermetically sealed devices in some circumstances. For example, galvanic corrosion can occur if moisture is present during the hermetic sealing process, if out-gassing occurs from packaging materials, or if leaks occur in the package after it is sealed.

To overcome the above-mentioned problem, an electrode structure including a gold-encapsulated adhesion layer was proposed in U.S. Pat. Ser. No. 10/261,877 filed on Oct. 1, 2002 to X. Chen. However, while the encapsulated adhesion layer mitigates the galvanic corrosion problem, it also introduces additional manufacturing steps in the electrode fabrication process.

It is an object of the instant invention to provide a metalized structure and a method of forming the metalized structure that reduces and/or eliminates the above-mentioned corrosion problems.

It is a further object of the instant invention to provide an electrode structure and a method of forming the electrode structure that obviates the need for an adhesion layer.

SUMMARY OF THE INVENTION

The instant invention provides an apparatus and method wherein galvanic corrosion at adhesion layers formed between electrodes and electronic or electro-optic substrates is eliminated. In particular, an electrode, such as a gold electrode, is deposited over a plasma-modified substrate surface, thereby forming an adherent electrode on the substrate without the need of an active metal adhesion layer.

In accordance with the instant invention there is provided a method of providing an electrode on a substrate comprising: exposing at least a portion of the substrate to a plasma so as to create an amorphous portion on a surface thereof; and depositing an electrode directly on a surface of the amorphous portion.

In accordance with the instant invention there is provided a method of preparing a lithium niobate substrate comprising: exposing at least a portion of the substrate to a plasma so as to create an amorphous portion on a surface thereof; and depositing gold directly on a surface of the amorphous portion.

In accordance with the instant invention there is further provided an electrode structure comprising: a substrate including a crystalline portion and an amorphous portion; a homogeneous electrode deposited on the substrate such that it is in direct contact with the amorphous portion.

In accordance with the instant invention there is further provided an electrode structure comprising: an electro-optic crystalline substrate; an amorphous layer disposed on the crystalline substrate, the amorphous layer having a composition substantially similar to a composition of the crystalline substrate; and a gold layer disposed directly on the amorphous layer.

Advantageously, the instant invention totally eliminates the need for an active metal adhesion layer. For example, in one embodiment the instant invention provides an all-gold electrode that is directly formed on a lithium niobate substrate using a novel surface modification technique. The all gold electrode exhibits excellent adhesion due to presence of the plasma-modified, amorphous interface layer between the gold and the crystalline lithium niobate substrate. Reliability and performance tests of non-hermetic optical modulators built with all-gold electrodes and lithium niobate substrates, in accordance with the instant invention, have shown superior performance over modulators constructed with conventional fabrication methods.

BRIEF DESCRIPTION OF THE DRAWINGS

The objects, features and advantages of the invention will be apparent from the following more particular description of embodiments of the invention. The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION OF PREFERRED EMBODIMENTS

The present invention relates to galvanic corrosion-free electrodes fabricated on electronic and electro-optic substrates. In particular, the present invention relates to an electrode, such as a gold electrode, that sits directly on a surface modified substrate, such as a lithium niobate substrate, without the incorporation of an active metal film as an adhesion layer.

Figure 1:
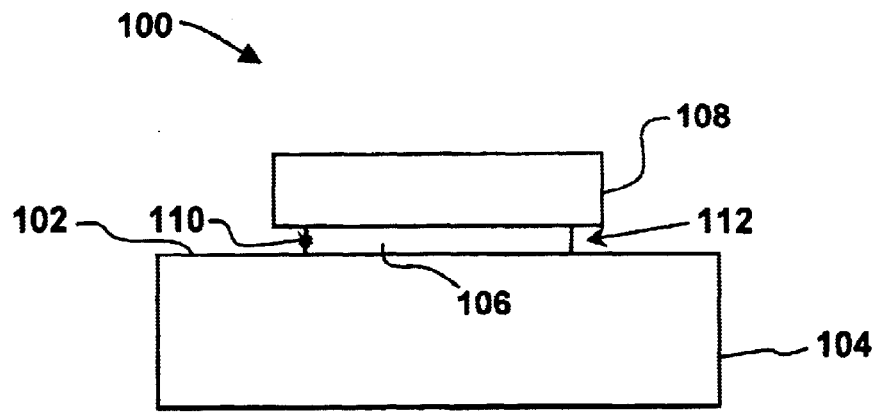
FIG. 1 illustrates a schematic cross-sectional view diagram of a prior art electrode structure that is fabricated on the top surface of an electro-optic substrate, such as a lithium niobate substrate.

Referring to FIG. 1, there is illustrated a prior art electrode structure that includes an adhesion layer. The electrode structure 100 includes an electrode layer 108 and a non-encapsulated adhesion layer 106, both of which are fabricated on the top surface 102 of an electro-optic substrate 104. This prior art electrode structure is fabricated using methods well known in the art.

For example, in one embodiment a TiW adhesion layer 106 is deposited directly on a lithium niobate substrate 104. Subsequently, a gold electrode layer 108 is sputtered on top of the TiW adhesion layer 106 in a desired pattern. The TiW layer is provided to allow bonding of the gold layer 108 to the substrate 104. The TiW adhesion layer 106 is etched in regions of the substrate that do not correspond to the positions of the patterned electrode.

As described above, electrode structures that are formed using these known methods typically exhibit an undercut 112 that results from the isotropic etching of the non-encapsulated adhesion layer 106. Galvanic corrosion 110 occurs at the undercut region of the electrode 108 where the non-encapsulated adhesion layer 106 is exposed to the ambient environment. For example, galvanic corrosion, as illustrated in FIG. 1, has been observed, on lithium niobate substrates with a TiW adhesion layer.

Figure 2:
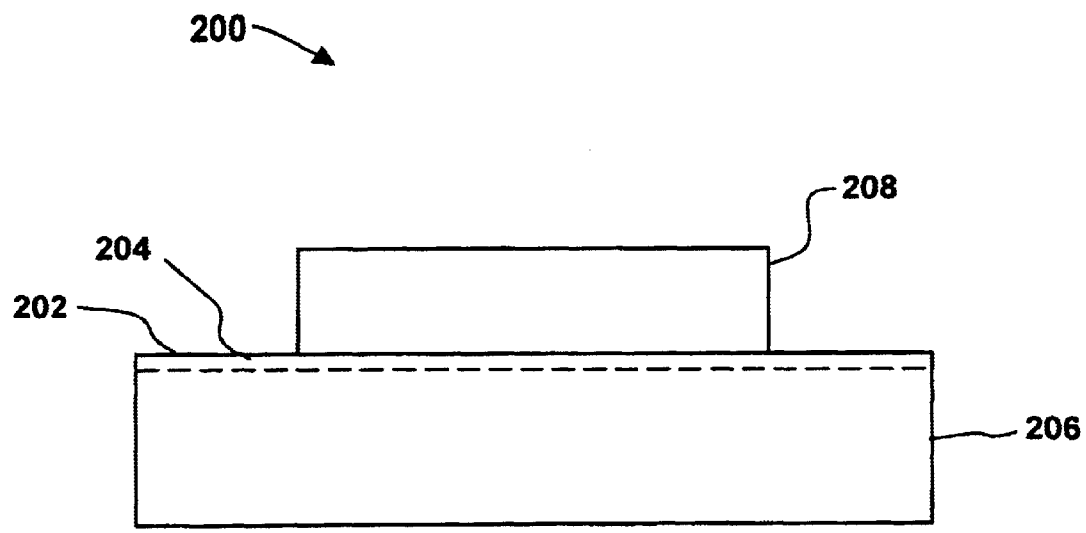
FIG. 2 illustrates a schematic cross-sectional view diagram of an electrode structure that is fabricated on a plasma-modified surface of an electro-optic substrate.

Referring to FIG. 2, there is shown an electrode structure in accordance with an embodiment of the instant invention that obviates the above corrosion problem(s). The electrode structure 200 includes an electrode layer 208 deposited directly on the surface of a substrate 206. In particular, the electrode layer 208 is deposited on the surface 202 of an amorphous layer 204 of the substrate 206 in the absence of an additional adhesion layer.

For exemplary purposes, the electrode layer is gold, the substrate is a lithium niobate substrate, and the electrode structure is for use in an optical modulator. Of course other homogeneous materials having high electrical conductivity and/or other substrate materials are possible for the electrode and substrate, respectively, depending on the type of device the electrode structure will be used in. For example, the substrate is optionally an electro-optic substrate or an electronic substrate. Possible substrate materials include lithium niobate, lithium tantalite, silicon, and gallium arsenide, while possible electrode materials include gold, copper, silver, platinum, and/or their alloys.

Figure 3:
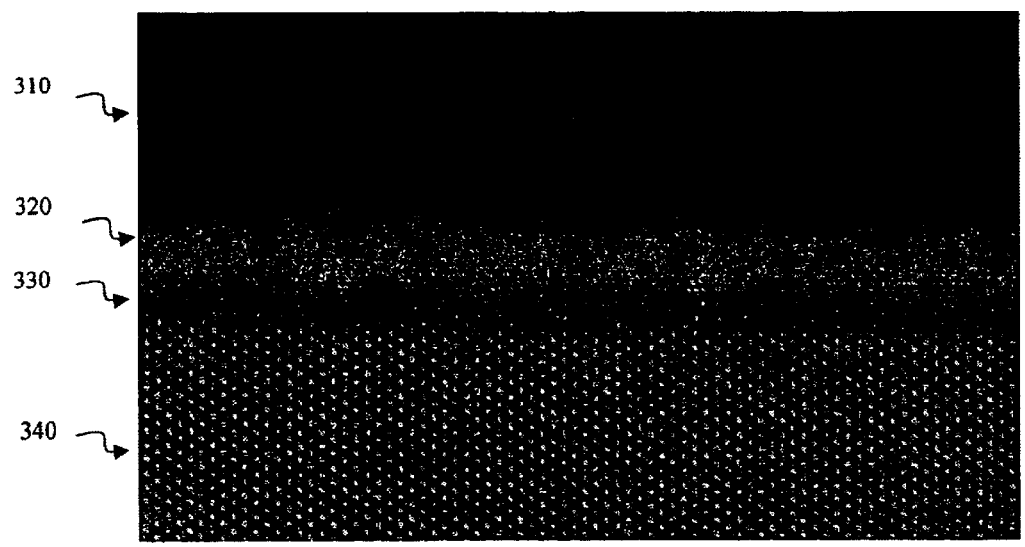
FIG. 3 is a high resolution transmission electron microscope image of an electrode structure showing a typical cross-sectional view of a plasma-modified lithium niobate surface layer (e.g., that is amorphous and about 20 angstrom thick)

The direct deposit of the gold electrode 208 on the lithium niobate substrate 206 is made possible because the surface 202 of the lithium niobate substrate 206 is pretreated to form the amorphous layer 204. This amorphous layer is clearly shown in the cross-section illustrated in FIG. 3. In particular, FIG. 3 shows a gold layer 310 disposed above an amorphous layer 320, which in turn is disposed above a semi-crystalline layer 330 and a crystalline layer 340. The cross-sectional view of the electrode structure was experimentally obtained using transmission electron microscopy.

While the adhesion mechanism associated with the surface modification is speculative, it is likely that the surface modification removes some lighter elements and surface contaminants, thus creating a fresh, clean and highly active surface. Furthermore, it is likely that the surface modification loosens the atomic structure of the very top surface layer, thus allowing good gold penetration and bonding with the substrate in the amorphous region.

Figure 4:
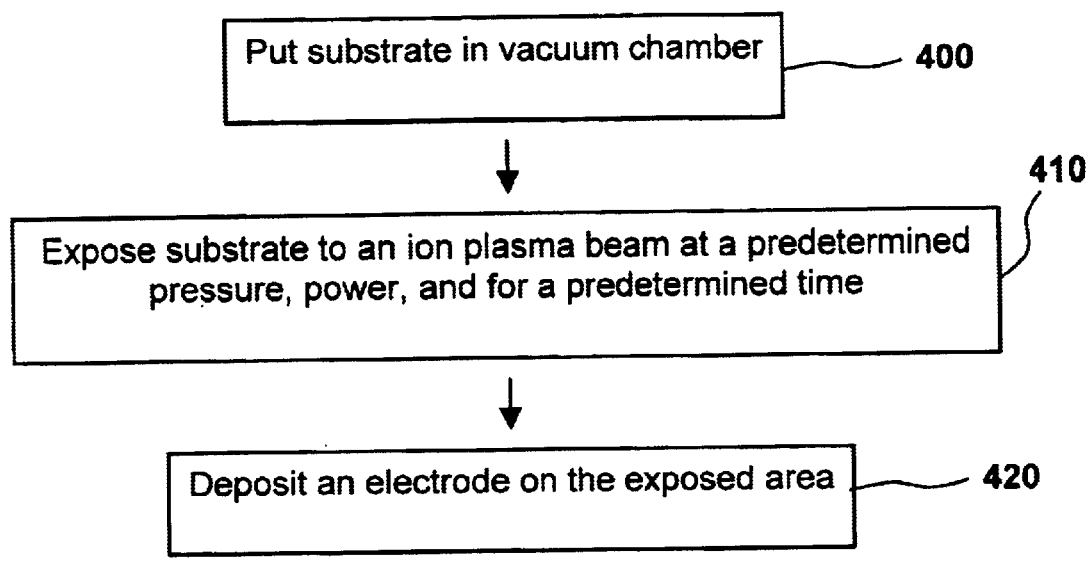
FIG. 4 is a schematic diagram illustrating a fabrication method in accordance with an embodiment of the instant invention.

Referring to FIG. 4, there is shown a schematic diagram illustrating an embodiment of a fabrication method used to produce the electrode structure shown in FIG. 2. In this embodiment, the amorphous layer is prepared through the surface modification of the lithium niobate substrate with an ion sputtering etch directly prior to the deposition of the gold electrode layer. This pre-etch with the ion plasma produces an amorphous layer, as for example shown in FIG. 3, that causes the gold to adhere to the substrate.

In a first step of the fabrication method 400, the lithium niobate substrate is provided to a high-vacuum chamber. In one embodiment, the substrate includes various optical waveguides, as for example formed from diffused titanium. In a second step 410, the lithium niobate substrate is subsequently bombarded with an argon ion beam under a set of conditions that provides an amorphous layer on the surface of the lithium niobate substrate. For example, in one embodiment the argon ion pressure is 10 mTorr and the argon ion beam is introduced at 600 W for at least 30 seconds to produce an amorphous layer approximately 20 Å thick. In another embodiment, the pressure is within the range from 5–15 mTorr, the power is 200 W or higher, and the duration is within the range of about 20 to 160 seconds. Of course, other ion etching conditions and/or other etching methods that provide an amorphous surface are also within the scope of the instant invention. Preferably, the amorphous region is at least 5 Å thick. In a third step 420, the gold electrode layer is deposited directly on the amorphous surface. Preferably, this step is executed while the substrate is still within the high-vacuum chamber. Subsequently, if desired, a thicker gold layer could be deposited and/or patterned using techniques known in the art, such as sputtering, evaporation, electroless plating, electro-plating, photolithography, wet (acid) etching, plasma etching, and/or liftoff. The use of sputtering techniques may promote the implantation of gold atoms in the amorphous layer since the sputtered gold atoms have additional kinetic energy. In particular, sputtering deposition is preferred in providing the immediate gold contact with the amorphous surface layer. Advantageously, the gold layer is deposited directly on the substrate in the absence of an adhesion layer(s). The gold layer forms the electrode(s).

For example, in one embodiment the gold layer is deposited first as a seed layer on the surface modified substrate. Subsequently, a layer of photopolymer is applied to the seed layer and is patterned using a standard lithography process. Metal electroplating is used to grow the gold electrode structure to a predetermined thickness in the photo-defined areas. In particular, the electroplating increases the thickness of the electrode structure in regions where the photopolymer is not present. The photopolymer is chemically removed so as to leave the electrode structure and exposed seed layer. The substrate is then immersed in an appropriate etchant to remove the thin areas of seed layer that were previously protected by photopolymer and to provide the all-gold electrode structure.

Advantageously, the all-gold electrode structure fabricated by the present invention exhibits excellent gold to lithium niobate adhesion and has the advantage of being easy to manufacture and free of galvanic corrosion problems. Furthermore, the all-gold electrode structure eliminates dissimilar metals in the structure, thereby obviating galvanic corrosion caused by dissimilar metals in the presence of moisture. In addition, this structure eliminates the undercut of the adhesion layer that often occurs beneath the gold electrode using known fabrication methods with an active metal adhesion layer. Elimination of the undercut improves the device performance and long-term reliability. Moreover, elimination of the adhesion layer reduces production steps and hence reduces product cost.

Notably, ion plasma etching has been used in the past to clean and/or prepare substrates for subsequent depositions. For example, it is known to clean lithium niobate substrates with argon ion plasma prior to depositing the adhesion layer shown in FIG. 1. However, while these convention techniques have satisfactorily prepared surfaces for bonding with active metals such as titanium, chromium, and TiW, they have not been successful in preparing the lithium niobate surface for bonding with noble metals such as gold, platinum or silver. As a result, prior art electrode structures generally include an adhesive layer, and all-gold electrodes have remained elusive until the instant invention. Conventional ion etching is discussed in U.S. Pat. No. 4,750,979, hereby incorporated by reference.

Ion plasma etches in accordance with the instant invention differ from ion plasma etches conventionally used to clean electronic or electro-optic substrates in that they modify the substrate to an extent that an amorphous layer with a desirable thickness is formed to which the otherwise non-adherent homogeneous electrode is able to adhere. For example, the pre-etch in accordance with the instant invention generally includes a power level sufficient to activate and roughen the surface so that the gold bonds well to the substrate.

Various adhesion tests have been performed to determine the integrity of an all-gold electrode structure fabricated in accordance with the instant invention. In particular, several all-gold electrode structures were fabricated using an ion sputtering etch for 30 seconds at 600 W and were subject to various sticky tape tests, cross-cut tape tests, and ultrasonic adhesion tests. The results for the all-gold electrode structures were compared to all-gold electrode structures fabricated without a pre-etch, with a pre-etch at a power levels below 200 W, and with an electrode structure including a TiW adhesion layer and a gold electrode. The composite Au/TiW/LiNbO$_3$ electrode structure and the all-gold electrode structures prepared with the pre-etch at sufficient power, consistently passed the adhesion tests with similar results. The all-gold electrode structures prepared without the pre-etch and with low-power pre-etch repetitively failed.

Other adhesion tests have demonstrated that the quality of adhesion is at least partially dependent on the ion etching power. In particular, poor adhesion of the gold electrode structure to the lithium niobate substrate is observed when the etching power is below 200 W, while better adhesion of gold to lithium niobate is exhibited for etching powers above 200 W. Preferably, the etching power is within the range between 200–800 W, and more preferably within the range between 400–700 W. In one test optimum adhesion was observed for electrode structures prepared with etching powers of approximately 600 W. Notably, conventional pre-etching powers have traditionally been limited to under 200 W to limit damage and preserve the surface stoichiometry of the substrate.

With respect to corrosion, laboratory testing has demonstrated that the composite Au/TiW/LiNbO$_3$ component in a non-hermetic optical modulator exhibits corrosion in less than 300 hours under 85° C. and 85% RH (relative humidity) conditions, but no corrosion for the all-gold electrode in a non-hermetic optical modulator subjected to the same conditions for 4000 hours.

In summary, laboratory testing supports that the electrode structure in accordance with the instant invention is substantially corrosion free and is about as robust as prior art electrode structures including an adhesion layer.

While the invention has been particularly shown and described with reference to specific embodiments, it should be understood by those skilled in the art that various changes in form and detail may be made therein without departing from the spirit and scope of the invention as defined herein.

What is claimed is:

1. A method of providing an electrode on a substrate comprising:
    a) exposing at least a portion of the substrate to a plasma so as to create an amorphous portion on a surface thereof; and
    b) depositing an electrode directly on a surface of the amorphous portion.

2. A method according to claim 1, wherein the electrode comprises gold.

3. A method according to claim 1, wherein the plasma comprises argon ion.

4. A method according to claim 1, wherein step (a) comprises exposing the substrate using a power above 200 Watts.

5. A method according to claim 1, wherein step (a) comprises exposing the substrate using a power of about 600 Watts.

6. An electrode structure comprising:
- a substrate including a crystalline portion and an amorphous portion, wherein the amorphous portion is formed by a surface modification, for activation and roughening of an upper layer of the crystalline portion;
- a homogeneous electrode deposited on the substrate such that it is in direct contact with the amorphous portion.

7. An electrode structure according to claim 6, wherein the substrate comprises one of an electronic and an electro-optic substrate.

8. An electrode structure according to claim 6, wherein the electrode comprises gold.

9. An electrode structure according to claim 6, wherein the substrate comprises one of lithium niobate, lithium tantalite, silicon, and gallium arsenide.

10. An electrode structure according to claim 9, wherein the electrode comprises one of gold, copper, silver, platinum, and alloys thereof.

11. An electrode structure according to claim 6, wherein the electrode comprises one of gold, copper, silver, platinum, and alloys thereof.

12. An electrode structure according to claim 6, wherein the amorphous portion comprises an amorphous layer ion plasma etched from a surface of the crystalline portion.

13. An electrode structure comprising:
- a substrate including a crystalline portion and an amorphous portion;
- a homogeneous electrode deposited on the substrate, whereby the homogeneous electrode is in direct contact with the amorphous portion;
- wherein the substrate comprises lithium niobate.

14. An electrode structure according to claim 13, wherein the electrode consists of gold.

15. An electrode structure comprising:
- an electro-optic crystalline substrate;
- an amorphous layer disposed on the crystalline substrate, the amorphous layer having a composition substantially similar to a composition of the crystalline substrate; and
- an electrode layer disposed directly on the amorphous layer.

16. An electrode structure according to claim 15, wherein the amorphous layer is in direct contact with both the crystalline substrate and the gold layer.

17. An electrode structure according to claim 15, wherein the crystalline substrate comprises lithium niobate.

18. An electrode structure according to claim 15, wherein the homogeneous electrode layer comprises a gold layer.

19. A method of preparing a lithium niobate substrate comprising:
- a) exposing at least a portion of the substrate to a plasma so as to create an amorphous portion on a surface thereof; and
- b) depositing gold directly on a surface of the amorphous portion.

20. A method according to claim 19, wherein the plasma comprises an argon ion plasma at a power of about 600 W.

21. A method according to claim 19, wherein the plasma comprises an ion plasma at a power greater than about 400 W.

22. A method according to claim 19, wherein the plasma comprises a plasma at a power sufficient to promote bonding of the gold to the substrate in the absence of an adhesion layer.

* * * * *